United States Patent [19]

Tchamov et al.

[11] Patent Number: 5,739,729
[45] Date of Patent: Apr. 14, 1998

[54] VOLTAGE-CONTROLLED LC OSCILLATOR

[76] Inventors: Nikolay Tchamov, Lindforsinkatu 21 A 17, FIN-33720 Tampere; Petri Jarske, Pirilänkuja 8, Fin-34240 Kämmenniemi, both of Finland

[21] Appl. No.: 755,039

[22] Filed: Nov. 22, 1996

[30] Foreign Application Priority Data

Nov. 24, 1995 [FI] Finland .................... 955673

[51] Int. Cl.⁶ .................... H03B 5/12
[52] U.S. Cl. .................... 331/117 R; 331/177 V
[58] Field of Search .................... 331/117 R, 177 FE, 331/177 V, 168

[56] References Cited

U.S. PATENT DOCUMENTS 4,573,025  2/1986  McKinzie, III .................... 331/117 R Primary Examiner—Siegfried H. Grimm
Attorney, Agent, or Firm—IP Group of Pillsbury Madison & Sutro LLP

[57] ABSTRACT

In a voltage-controlled LC oscillator, a series LC resonance circuit is connected between two transistor amplifying stages which provide low impedance input and output circuits for the LC circuit. The collector of the first transistor stage is connected through a coil to the operating voltage. The emitter of the second transistor stage is connected to the reference voltage through a coil. This will result in narrow-band transistor stages and significant advantages in the power consumption and other characteristics of the oscillator.

8 Claims, 2 Drawing Sheets

5,739,729

VOLTAGE-CONTROLLED LC OSCILLATOR

FIELD OF THE INVENTION

The present invention relates to voltage-controlled LC oscillators.

BACKGROUND OF THE INVENTION

Voltage-controlled oscillators are used in many applications of electronics and telecommunications. Phase-locked loops PLL, frequency oscillators, modulators and the like are typical applications in telecommunications.

It is common to all voltage-controlled oscillators that the output frequency of the oscillator is regulated by an external control voltage. A LC type of oscillator is one of the most common voltage-controlled oscillators for oscillator frequencies of approximately 1 GHz and higher. An LC oscillator comprises a parallel or serial connection of capacitance (C) and inductance (L) and provides a resonance circuit. An amplifying stage of one transistor with positive feedback is also typically employed so as to make the resonance circuit oscillate on a resonance frequency. The LC oscillator generates a pure sinusoid signal when the active components of the oscillator circuit are maintained within the linear range of operation. A very low noise level will be naturally obtained within the linear range of operation without filter circuits that would attenuate non-desired spectrum components. Therefore LC oscillators generally have a good signal/noise ratio (S/N).

The resonance frequency of a voltage-controlled LC oscillator is dependent on the values of the inductance L and the capacitance C in the resonance circuit. Frequency control of an oscillator is achieved by changing either the values of the inductance L, of the capacitance C or of both. In practice, it has been found out to be easiest to adjust the value of the capacitance C by utilizing the fact that the barrier capacitance of a PN semiconductor junction (diode) has voltage sensitivity which is referred to as a varactor phenomenon. Therefore a varactor diode is typically used as the capacitance C of the LC circuit.

However, a more problematic component in LC circuits is inductance L of which a very high Q factor (quality factor) is required in prior art oscillator circuits. A coil (inductor), which is suitable for a frequency range of less than 1 GHz, has too great dimensions and too low a Q factor so that it could be integrated on a silicon chip. Silicon technologies are more advantageous in a frequency range of few GHz, but parasitic circuit elements of the coil are still considered to prevent implementation of the coil on a silicon chip. Therefore the coil in conventional oscillator designs is an externally mounted component, which causes problems in encapsulation and mounting and raises costs. Also, circuit solutions used generally in voltage-controlled oscillators are set requirements for a high Q factor of the coil, and this has occasioned the use of an external coil. In circuits based on GaAs technology it is possible to implement a sufficiently good coil on a silicon chip but mostly only on higher frequencies than few GHz. Unfortunately, the Q factor of the coil on the chip then varies to a great extent and causes instability in the oscillation.

Because of specific characteristics of the equipment and the circuit, a parallel LC resonance circuit is generally used in LC oscillator circuits. A parallel LC resonance circuit requires that the supply of energy to the resonance circuit is carried out with a current generator, or a voltage generator having a high internal impedance. Also, the output energy of resonance has to be taken out by amplifier components having a high input impedance. Briefly, loading a parallel LC resonance circuit by low input and output impedances will completely impede the starting of oscillation. Therefore complicated circuits are needed for maintaining oscillation in a parallel LC resonance circuit. Furthermore, as the input and output impedances are high, they provide noise with a good route directly to a parallel LC resonance circuit. Even when noise has a low energy, high input or output impedance is sufficient for keeping the noise "alive" Signal/noise ratio (S/N) cannot therefore be very high in circuits where impedance is high.

There are also problems associated with frequency control in conventional voltage-controlled LC oscillators. In conventional oscillator circuits the control voltage, which adjusts the voltage across a varactor, is connected to either of the terminals of the varactor. When control voltage is supplied to this point, great care should be taken that no interference is created in the high impedance circuit described above. Further, leaking of high frequency energy of the resonator circuit through this control point should be impeded. In order to meet these requirements, it is required to have so-called RFC coils with a sufficiently high inductive impedance on the resonance frequency of the oscillator. In practice, the impedance of an RFC coil has to be 10 to 100 times higher than the inductance of the resonance circuit, and thus it is unrealistic to implement them into integrated circuits. Instead, they have to be implemented as external components, which will cause additional costs. In certain cases RFC coils can be avoided by replacing them by resistors of high value. But no solution will completely avoid direct interference in the resonance circuit, which will cause increased parasitic circuit elements, noise and a lower stability of oscillator frequency. Therefore there are problems associated with direct voltage control of the varactor.

FIG. 1 shows an LC oscillator structure in which the problems described above have been considerably reduced or completely removed. In this oscillator structure a serial LC resonance circuit is used comprising a connection of an inductance L1 and at least one PN semiconductor junction (transistor Q6) in series. An LC resonance circuit L1,Q6 is connected between one main electrode of the transistor stage Q2 and a corresponding main electrode of the other transistor stage Q5 so that the PN semiconductor junction of the transistor Q6 is reverse biased. The transistor stages Q2 and Q5 act as an amplifying part of the oscillator and provide low impedance input and output circuits for the LC circuit L1,Q6. As a result of this, a serial LC circuit L1,Q6 is loaded by very low input and output impedances which improves the signal/noise ratio (S/N) of the oscillator. The reverse-biased PN semiconductor junction of the transistor Q6 acts as a varactor-type of component, the capacitance C of the reverse-biased PN junction determining the frequency produced by the oscillator. External control voltage AC or DC changes the biasing of the transistor stage Q2 so that the potential at the main electrode of Q2 and thereby the potential difference between the transistor stages Q2 and Q5 will change. Thus external control voltage AC or DC will indirectly change the voltage across the reverse-biased PN junction of Q6. Thus a nearly complete separation is attained between the external control voltage AC or DC and the actual oscillation circuit without the usually required additional components. In other words, the control circuit and the varactor Q6 have no common node in the circuit. Furthermore, there are very low impedances of the transistor stage Q2 between the control circuit and the PN junction of Q6, and if any interferences of parasitic components should occur, it will be attenuated to a great extent because of energy losses caused by these small impedances. This way interference problems associated with oscillator circuits described above will be obviated. The oscillator circuit may also oscillate on very low Q factors of the coil L1, which allows the implementation of the coil L1 as a small-sized coil on a silicon chip by using silicon technology. Because of this, the voltage-controlled oscillator as a whole can be implemented by conventional manufacturing methods and processes into an integrated circuit.

SUMMARY OF THE INVENTION

The object of the present invention is to further improve the two-stage amplifier and the characteristics of a voltage-controlled LC oscillator which uses a serial LC circuit.

The object is achieved with a voltage-controlled LC oscillator comprising a first low impedance transistor stage; a second low impedance transistor stage; an LC circuit comprising a first inductance and a serial connection of at least one reverse-biased PN semiconductor junction operationally connected between the first main electrode of the first transistor stage and the corresponding first main electrode of the second transistor stage in such a manner that a control voltage of the oscillator applied to the control electrode of the first transistor stage adjusts reverse-biasing of said at least one PN junction and thereby the capacitance of said at least one PN junction and the resonance frequency of the oscillator; a second inductance which connects the second main electrode of the first transistor stage to a first operating voltage so that the DC potential at the second main electrode is essentially equal to the first operating voltage; a third inductance which connects the first main electrode of the second transistor stage to a second operating voltage so that the DC potential at the first main electrode is essentially equal to the second operating voltage.

In the LC oscillator of the preferred embodiment of the invention, the main electrode in the first transistor amplifying stage of the oscillating loop, which is not connected to the LC circuit, is connected to a first operating voltage through an inductance, such as a coil. In the prior art LC oscillator, shown in FIG. 1, this main electrode is connected to the operating voltage through a series resistor. Further, in the LC oscillator of the preferred embodiment of the invention, the main electrode of the second transistor amplifying stage, which is connected to a serial LC circuit, is connected to a second operating voltage through an inductance, such as a coil. The second operating voltage is preferably 0 VDC. In the prior art LC oscillator, shown in FIG. 1, this main electrode is connected to the operating voltage through a series resistor, a sink or a current mirror. This results in significant changes in the operation of the LC oscillator:

A) Transistor amplifying stages are no more broadband amplifiers, as in the prior art LC oscillator, but they will be narrowband amplifiers. This provides many advantages of which huge gain and low noise are the major ones.

B) The use of coils in place of resistors makes it possible to decrease DC voltage supply to almost ultimate minimum. For example, in a circuit implementation based on 0.8 µM BiCMOS technology, the oscillator is able to operate successfully starting from as low DC voltage supply as 0.8 to 1.0 V, whereas the corresponding value in the prior art oscillator was approximately 2.0 to 2.2 V. This will, in turn, result in a considerably lower power consumption. For example, in the circuit implementation based on 0.8 µM BiCMOS technology mentioned above, power consumption of the oscillator of the invention could be about 0.42 mW, while the power consumption of the prior art oscillator was about 2 mW.

C) Although the smallest DC voltage supply could be cut to less than half, the amplitude of the output signal obtained from the oscillator would be more than two times higher. This is a result of narrowband amplifiers in step A). For example, in the circuit implementation based on 0.8 µM BiCMOS technology mentioned above, the signal amplitude in the output of the second transistor amplifying stage is about 470 mV, while the corresponding amplitude in the prior art oscillator was about 220 V.

D) A low DC voltage supply makes it possible to use smaller resistances in the circuit. This is followed by the oscillator of the invention being able to operate on much higher frequencies than before. For example, in the circuit implementation based on 0.8 µM BiCMOS technology mentioned above, the oscillator of the invention operates up to frequencies of about 6.7 GHz, while the prior art oscillator operated up to frequencies of 2.3 GHz.

E) The places in the oscillator stage in which the coils of the invention are placed, make it possible to use coils with low Q factors. This will make it easier to implement the circuit even by the BiCMOS technology mentioned above.

In the second embodiment of the invention said at least one pn-junction comprises a base-collector junction of a transistor connected as a diode (or several base-collector junctions of transistors connected in series), the base and emitter of the transistor being connected to the first main electrode of the second transistor stage and the collector being connected to the first main electrode of the first transistor stage. In other words, the transistor operating as a varactor is connected in the opposite direction to that in the prior art oscillator. This will provide several advantages. The transistor serving as a varactor operates now with one terminal practically at a potential 0 VDC, via the second coil of the invention. This enables first of all the operation of the varactor on a lower biasing voltage, whereby the effectiveness of the varactor is much higher because of the non-linear character of the frequency/voltage characteristic (C/V). Further, it will result in almost two times better temperature stability in the frequency setting of the oscillator. Generally in a oscillator of the invention the varactor is always biased correctly, which makes it more protected against problems caused by temperature or other factors.

The invention also includes other features and advantages which will become apparent from the accompanying claims and the following explanation.

BRIEF DESCRIPTION OF THE FIGURES

In the following, the invention will be explained by means of primary embodiments with reference to the appended drawing, where.

PRIMARY EMBODIMENTS OF THE INVENTION

Figure 1:
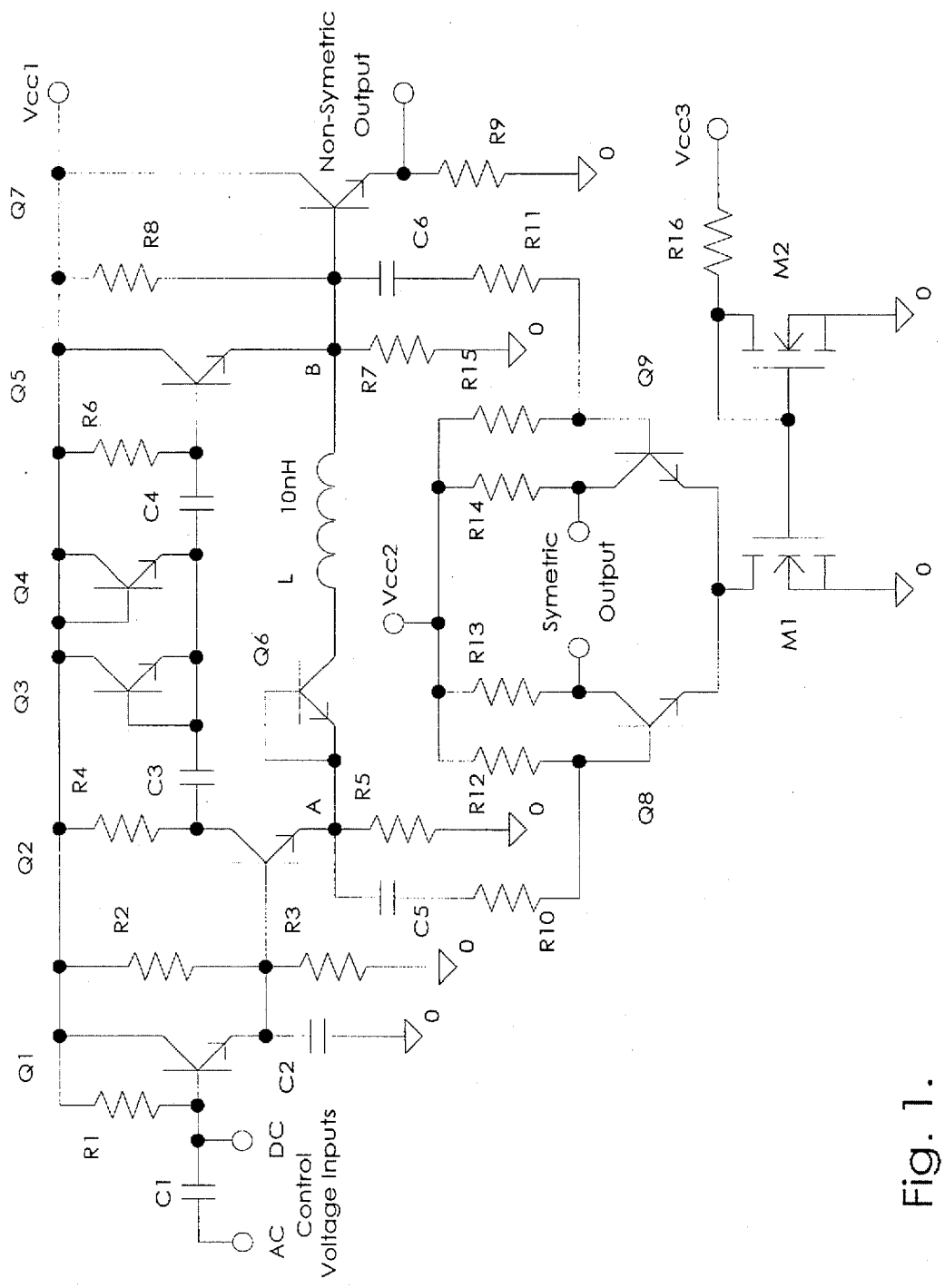
FIG. 1 shows a circuit diagram of a prior a voltage-controlled oscillator.
Figure 2:
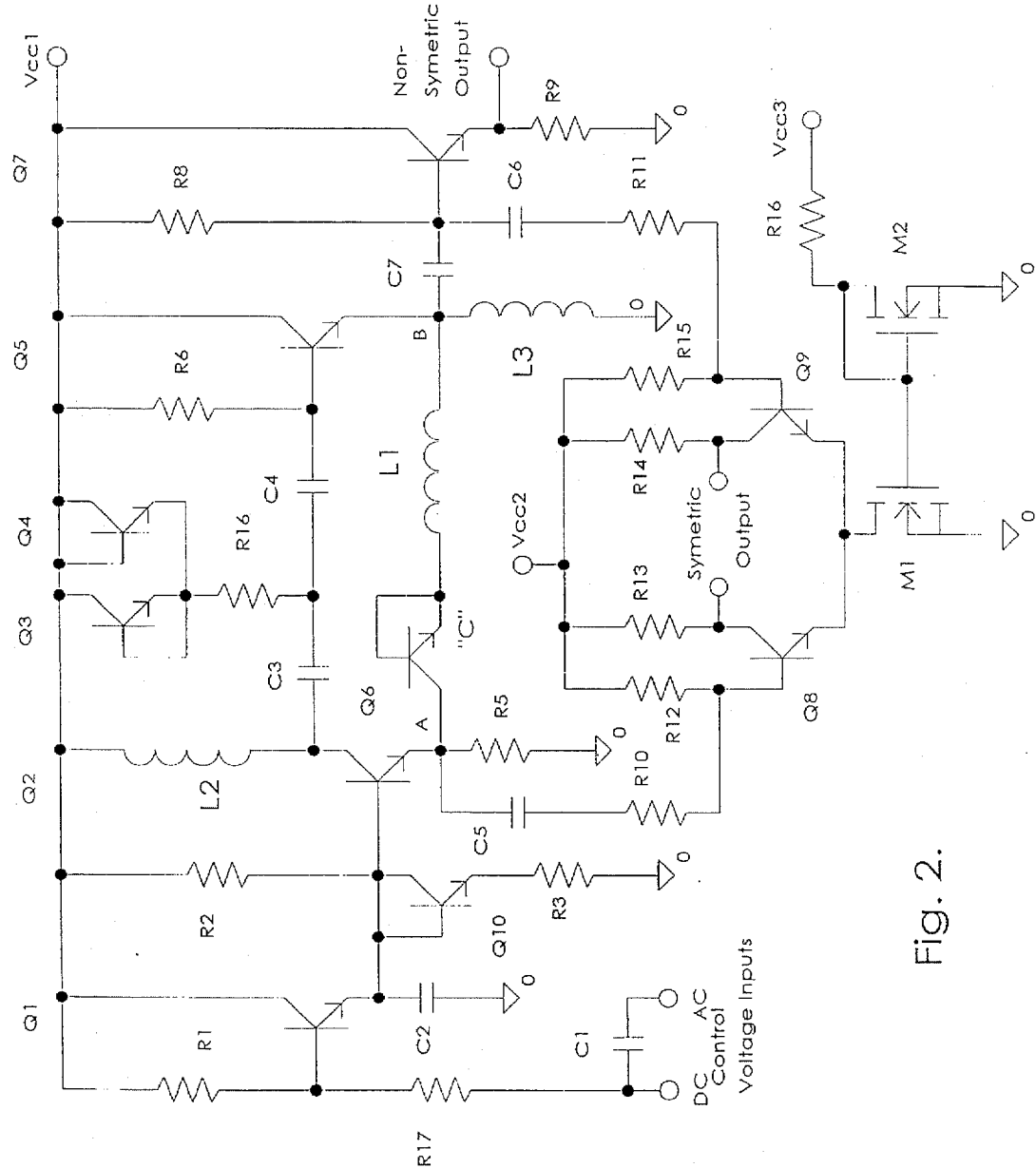
FIG. 2 shows a circuit diagram of a voltage-controlled oscillator of the invention.

In FIG. 2 the LC circuit is provided by a series connection of the base-collector junction of the transistor Q6 and the inductance L1 between the circuit points A and B. The base and emitter of the transistor Q6 are connected together to the other terminal of the coil L1, while the collector is connected to circuit point A. As stated earlier, this is opposite to the connection of Q6 in FIG. 1. The opposite terminal of the coil L1 is connected to the circuit point B. The transistor Q6 is in a diode type of connection and when the potential at point B is higher than the potential at point A, the base-collector junction of the transistor Q6 is a reverse-biased PN semiconductor junction whose barrier capacitance forms a capacitance portion C of the LC circuit. In other words, Q6 operates as if it were a varactor (an adjustable capacitance diode). In practice, the capacitance of the LC circuit can be formed of several PN junctions connected in series, each of which is implemented by a transistor which is connected in the same way as the transistor Q6. Although a base-collector junction is disclosed as a varactor in FIG. 2, barrier capacitance of the base-emitter junction can also be alternatively used.

The transistors Q2 and Q5 provide an amplifier with a positive feedback via a serial LC circuit, which will form an oscillator.

Q2 provides a common-base connected voltage amplifier. Biasing resistors R2, R3 and R5 and a coil L2 and a transistor Q10 set the operating point of the transistor Q2.

Differing from the oscillator circuit of FIG. 1, the collector of the transistor Q2 is connected through the coil L2 to the operating voltage $V_{cc1}$. The DC potential of the Q2 collector is practically the same as the operating voltage $V_{cc1}$. The transistor stage Q1 operates as an amplifier only within a very narrow frequency band which corresponds to the resonance frequency of the coil L2. The coil 2 short circuits frequencies outside this frequency band to an operating voltage supply.

The emitter of the transistor Q2 is connected to point A which is further connected through the biasing resistor R5 to a reference potential, such as 0VDC. The base circuit of the transistor Q2 comprises a voltage divider formed by the resistors R2 and R3 and the transistor Q10. More precisely, the base electrode of the transistor Q2 is connected through the resistance R2 to the operating voltage $V_{cc1}$. The base and collector electrodes of the common-collector connected transistor Q10 are connected to the base electrode of Q2, whereas the emitter of the transistor Q10 is connected through the series resistor R3 to a reference potential, such as 0 VDC. In the series connection of the common-collector connected control transistor and the resistor between the control electrode and the second operating voltage, the transistor operates as a constant-current generator which keeps the current passing through the resistor constant. The transistor Q10 is an addition to the oscillator circuit of FIG. 1. The adding of the transistor Q10 improves temperature stability by compensating the temperature dependency of the base-emitter voltage of the transistor Q2. Similar compensation can also be added to other amplifying stages.

The transistor Q5 provides a common-collector connected current amplifier. Although Q5 in FIG. 2 is a bipolar transistor, it may also be an MOS-type of transistor. The biasing resistor R6 and the coil L3 set the operating point of the transistor Q5. The base of the transistor Q5 is connected via the resistor R6 to the operating voltage $V_{cc1}$. If a higher operational frequency and better temperature stability is required, R6 can be replaced by a similar voltage divider that is provided by R2, R3 and Q10. The collector of Q5 is connected directly to the operating voltage $V_{cc1}$. The emitter of Q5 is connected to the circuit point B.

Differing from the oscillator circuit in FIG. 1, the emitter of Q5 is connected via the coil L3 to a reference potential, such as 0VDC. The DC potential at the emitter of Q5 is practically the same as the reference voltage 0VDC. The transistor stage Q5 operates as an amplifier only within a very narrow frequency band which corresponds to the resonance frequency of the coil L3. The coil L3 short circuits frequencies outside this frequency band to the reference voltage supply.

The collector of the transistor Q2 is connected to the base of the transistor Q5 via the serial connection of DC decoupling capacitors C3 and C4. The base and the emitter of a the transistor Q3 and the emitter of a transistor Q4 are connected to one end of the serial resistor R16 and the other end of resistor R16 is connected to the junction of the capacitors C3 and C4. The collector of the transistor Q3 and the collector and base of the transistor Q4 are connected to the operating voltage Vcc1. The transistors Q3 and Q4 are in a diode-type of connection serving as non-linear voltage limiters. The serial resistor R16 enables a constant amplitude and adjustment of non-linear distortion. Although the transistors Q3 and Q4 are bipolar transistors in FIG. 1, MOS-type of transistors may be used as well.

The transistor Q1 provides a common-collector connected input buffer stage. The base of the transistor Q1 is connected through the resistor R1 to the operating voltage VCC1. The collector of Q1 is connected directly to the operating voltage Vcc1. The emitter of the transistor Q1 is connected to the base of the transistor Q2. Furthermore, Q1 is connected with a radio frequency bypass capacitor to the reference potential. External DC voltage acting as control voltage of the oscillator can be connected to the control input DC which is connected onto the base of the transistor Q1 through a serial resistor R17. External alternating voltage acting as control voltage of the oscillator can be connected to the control input AC which is connected onto the base of the transistor Q1 through a decoupling capacitor C1 and the serial resistor R17. The serial resistor R17 is an addition to the oscillator connection of FIG. 1. The serial resistor R17 enables better short-circuit difference between the base of the transistor Q1 and the control voltage supply.

The transistor Q7 provides a non-symmetric output buffer stage of the oscillator circuit which is in common-collector connection. The base of the transistor Q7 is connected via the resistor R8 to the operating voltage Vcc1. The collector of Q7 is connected directly to the operating voltage Vcc1. The emitter of Q7 which provides the non-symmetric output terminal of the oscillator is connected via the resistor R9 to the reference potential. The resistors R8 and R9 are biasing resistors which set the operating point of the transistor Q7. The transistor Q7 may also be an MOS-type of transistor.

Differing from the oscillator circuit of FIG. 1, the emitter of the transistor Q5 is connected to the base of the transistor Q7 via a decoupling capacitor C7. This will enable low voltage operation of the buffer stage provided by Q7.

The transistors Q8 and Q9 provide a differential amplifier which enables the symmetric output of the oscillator circuit. One input (the base of the transistor Q8) of the differential amplifier is connected through the resistor R10 and the capacitor C5 to circuit point A. The other input (the base of the transistor Q9) of the differential amplifier is connected through the resistor R11 and the capacitor C6 to circuit point B. The symmetric output is obtained from the collectors of the transistors Q8 and Q9. The resistors R12 to R15 are biasing resistors which set the differential amplifier into operating state. This differential amplifier may be replaced by any high-speed differential amplifier circuit.

The transistors M1 and M2 provide a current mirror which keeps the emitter current of the transistors Q8 and Q9 constant.

It is also to be noted that for very high frequencies, Hybrid Bipolar Transistors (HBT) may be used in place of bipolar transistors and High-Electron-Mobility Transistors (HEMT) in place of MOS transistors. Generally speaking, the circuit may be implemented with any type of transistors and even with electron vacuum tubes. In the following, the operation of the voltage-controlled oscillator shown in FIG. 1 is described. The explanation of the operation is divided into two sections: 1) a section describing the operation of the oscillating circuit, and 2) a section describing voltage regulation.

1) Oscillation

The transistors Q2 and Q5 provide an amplifier that forms an oscillator together with positive feedback formed via a serial LC circuit. The LC circuit feedbacks only a signal of the resonance frequency at which the oscillator will start to oscillate. There is no feedback on any other frequencies than resonance frequency and thus oscillation is not even possible. As a serial LC circuit derives its energy from a small output capacitance of a common-collector connected transistor stage Q5 and it is loaded by a small input impedance of the common-base connected transistor stage Q2, almost all the interference from other parts of the circuit are conducted to ground via these small impedances. Oscillation conditions will be attained when positive feedback is amplified sufficiently. The amplitude of ongoing oscillations is limited by the transistors Q3 and Q4.

2) voltage regulation

A barrier voltage is supplied over the base-collector junction of the transistor Q6, the voltage being the difference of the voltage at the emitter of the transistor Q2 (point A) and the voltage 0 VDC at the emitter of the transistor Q5 (point B). This voltage difference is provided by biasing the transistors Q2 and Q5. The transistor Q6 is preferably a parallel connection of several corresponding transistors in order to attain the capacitance required for the LC circuit, as well as required frequency deviation. When the control voltage changes at the control input AC or DC, the current through the transistor Q1 will also change and as a result, the current through the transistor Q2, too, which will make the voltage across the resistor R5 to change. The voltage across the resistor R7 will remain unchanged. Then the voltage difference between the points A and B will change. In that way the voltage, which has an effect over the capacitance of the reverse PN junction of the transistor Q6, will change, which will result in a change in the capacitance of the reverse PN junction and in the oscillation frequency which is determined by this capacitance and the inductance. The control curve of the voltage-controlled oscillator is similar to the voltage-capacitance-curve of the varactor which is an externally mounted component in conventional voltage-controlled oscillators. A radio frequency capacitor may be added alongside the transistor Q6 to linearize the frequency control curve and ensure precision and frequency deviation ranges. As was stated above, the capacitance of reverse PN junction in the base-emitter junction may also be used in the transistor Q6 for smaller deviation ranges and higher frequencies.

Although the invention has been explained with reference to specific embodiments, it is to be understood that the shown embodiments are only examples and they can be changed and modified without deviating from the spirit and scope of the invention specified in the accompanying claims.

We claim:

1. A voltage-controlled LC oscillator comprising a first low impedance transistor stage comprising a first and second main electrode, and a control electrode, a second low impedance transistor stage comprising a first and second main electrode, and a control electrode, an LC circuit comprising a first inductance and a serial connection of at least one reverse-biased PN semiconductor junction, the serial connection being operationally connected between the first main electrode of the first transistor stage and the corresponding first main electrode of the second transistor stage in such a manner that a control voltage of the oscillator applied to the control electrode of the first transistor stage adjusts reverse-biasing of said at least one PN junction and thereby the capacitance of said at least one PN junction and the resonance frequency of the oscillator;

a second inductance which connects the second main electrode of the first transistor stage to a first operating voltage so that the DC potential at the second main electrode is essentially equal to the first operating voltage;

a third inductance which connects the first main electrode of the second transistor stage to a second operating voltage so that the DC potential at the first main electrode is essentially equal to the second operating voltage.

2. An LC oscillator according to claim 1, wherein said at least one PN junction comprises a base-emitter junction of a diode-type connected transistor, the base and emitter of the transistor being connected to the first main electrode of the second transistor stage and the collector being connected to the first main electrode of the first transistor stage.

3. An LC oscillator according to claim 1, wherein the second operating voltage is a DC voltage of about 0 volt.

4. An LC oscillator according to claim 1, wherein the first transistor stage is a common-base connected voltage amplifier and the second transistor stage is a common-collector connected current amplifier, and wherein the series LC circuit is connected between the emitter electrodes of the first and second transistor stages, and wherein the second inductance is connected between the collector of the first transistor stage and the first operating voltage, and wherein the third inductance is connected between the emitter electrode of the second transistor stage and the second operating voltage.

5. An LC oscillator according to claim 1, wherein the control electrode of the first transistor stage is provided with a biasing circuit comprising a serial connection of a common-collector connected transistor and a resistor between the control electrode and the second operating voltage, said common-collector connected transistor operating as a constant-current generator which maintains the current through the resistor constant.

6. An LC oscillator according to claim 1, wherein the control voltage of the oscillator is connected to the control electrode of the first transistor stage through a buffer transistor stage, and wherein the control voltage is connected to the control electrode of the buffer transistor stage through a serial resistor which provides a short-circuit separation towards the control voltage power supply.

7. An LC oscillator according to claim 4, wherein the collector of the first transistor stage is connected to the base of the second transistor stage through the serial connection of decoupling capacitors, and wherein the junction between the decoupling capacitors is connected by a serial resistor to emitters of a pair of diode-type connected transistors, the collectors of the transistors and the base of one transistor being connected to the first operating voltage, and the base of the other transistor being connected to the emitter thereof.

8. An LC oscillator according to claim 1, wherein said first, second and third inductances are coils.

* * * * *